United States Patent
Li et al.

(10) Patent No.: US 12,341,515 B2
(45) Date of Patent: Jun. 24, 2025

(54) DELAY-LOCKED LOOP, DELAY LOCKING METHOD, CLOCK SYNCHRONIZATION CIRCUIT, AND MEMORY

(71) Applicant: CHANGXIN MEMORY TECHNOLOGIES, INC., Hefei (CN)

(72) Inventors: Siman Li, Hefei (CN); Yoonjoo Eom, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 35 days.

(21) Appl. No.: 18/450,959

(22) Filed: Aug. 16, 2023

(65) Prior Publication Data

US 2024/0056083 A1 Feb. 15, 2024

Related U.S. Application Data

(63) Continuation of application No. PCT/CN2022/118587, filed on Sep. 14, 2022.

(30) Foreign Application Priority Data

Aug. 11, 2022 (CN) .......................... 202210962473.4

(51) Int. Cl.
  *H03K 21/02* (2006.01)
  *H03K 3/037* (2006.01)
  *H03K 3/86* (2006.01)

(52) U.S. Cl.
  CPC ............. *H03K 21/02* (2013.01); *H03K 3/037* (2013.01); *H03K 3/86* (2013.01)

(58) Field of Classification Search
  CPC ..................................................... H03K 21/02
  (Continued)

(56) References Cited

U.S. PATENT DOCUMENTS

| 7,205,924 B2 | 4/2007 | Vemulapalli |
| 7,872,924 B2 | 1/2011 | Ma |

(Continued)

FOREIGN PATENT DOCUMENTS

| CN | 101320972 A | 12/2008 |
| CN | 102468843 A | 5/2012 |

(Continued)

OTHER PUBLICATIONS

International Search Report in the international application No. PCT/CN2022/118587, mailed on Dec. 21, 2022. 3 pages.

(Continued)

*Primary Examiner* — Tomi Skibinski
(74) *Attorney, Agent, or Firm* — Syncoda LLC; Feng Ma

(57) ABSTRACT

Provided are a delay-locked loop (DLL), a delay locking method, a clock synchronization circuit, and a memory. The DLL includes: a frequency division module, configured to receive an input clock signal, perform frequency division on the input clock signal, and output an intermediate clock signal; a first adjustable delay line, configured to receive the intermediate clock signal, adjust and transmit the intermediate clock signal, and output a synchronous clock signal; a delay module, configured to receive the input clock signal, perform delay transmission on the input clock signal, and output a sampling clock signal; and a latching module, configured to receive the sampling clock signal and the synchronous clock signal, latch the synchronous clock signal on the basis of the sampling clock signal, and output a group of target clock signals.

18 Claims, 6 Drawing Sheets

(58) Field of Classification Search
USPC .......................................................... 327/291
See application file for complete search history.

(56) References Cited

U.S. PATENT DOCUMENTS

| | | | |
|---|---|---|---|
| 11,437,085 | B2 | 9/2022 | Choi |
| 11,568,916 | B2 | 1/2023 | Choi |
| 2006/0103566 | A1 | 5/2006 | Vemulapalli |
| 2007/0069779 | A1 | 3/2007 | Kim |
| 2009/0245010 | A1 | 10/2009 | Searles |
| 2010/0103746 | A1 | 4/2010 | Ma |
| 2021/0075429 | A1 | 3/2021 | Han |
| 2021/0075430 | A1 | 3/2021 | Han |
| 2021/0143807 | A1 | 5/2021 | Kim |
| 2021/0152166 | A1 | 5/2021 | Kim |
| 2021/0305989 | A1 | 9/2021 | Han |
| 2021/0358534 | A1 | 11/2021 | Choi |
| 2022/0052700 | A1 | 2/2022 | Han |
| 2022/0052701 | A1 | 2/2022 | Han |
| 2022/0077861 | A1 | 3/2022 | Lin |
| 2022/0343965 | A1 | 10/2022 | Choi |
| 2024/0003969 | A1* | 1/2024 | Kolla ............... G01R 31/31725 |

FOREIGN PATENT DOCUMENTS

| | | | |
|---|---|---|---|
| CN | 103441757 | A | 12/2013 |
| CN | 106549664 | A | 3/2017 |
| CN | 111865300 | A | 10/2020 |
| CN | 112468138 | A | 3/2021 |
| CN | 113098499 | A | 7/2021 |
| CN | 113674779 | A | 11/2021 |
| CN | 115065359 | A | 9/2022 |
| KR | 20000077451 | A | 12/2000 |
| WO | 2005008894 | A1 | 1/2005 |

OTHER PUBLICATIONS

International Search Report in the international application No. PCT/CN2022/114860, mailed on Apr. 11, 2023. 3 pages.

First Office Action of the Chinese application No. 202210959922.X, issued on Sep. 27, 2022. 16 pages with English translation.

Gan Wubing, Xia Tingting, Zhen Shaowei, He Yajuan, Chen Jingbo, A Novel All Digital Multi-Phase Clock Generator with Low Non-linearity, Microelectronics, p. 467-p. 471, Aug. 20, 2014. 5 pages with English abstract.

Zhang, D., Yang, H.-G., Zhu, W., Li, W., Huang, Z., Li, L., & Li, T. (2015). A Multiphase DLL With a Novel Fast-Locking Fine-Code Time-to-Digital Converter. IEEE Transactions on Very Large Scale Integration (VLSI) Systems, 23(11), p. 2680-2684. doi:10.1109/tvlsi.2014.2369460, Nov. 9, 2014. 5 pages.

* cited by examiner

DELAY-LOCKED LOOP, DELAY LOCKING METHOD, CLOCK SYNCHRONIZATION CIRCUIT, AND MEMORY

CROSS-REFERENCE TO RELATED APPLICATIONS

This application is continuation of international application PCT/CN2022/118587 filed on Sep. 14, 2022, which claims priority to Chinese Patent Application No. 202210962473.4 filed on Aug. 11, 2022, contents of both of which are hereby incorporated by reference in their entireties.

BACKGROUND

In a Dynamic Random Access Memory (DRAM), a DLL needs to perform phase synchronization and locking on a four-phase clock signal (i.e., 4 clock signals of which phases differ by 90 degrees in turn), so as to subsequently generate a data clock signal; and the data clock signal is configured to sample a data signal DQ. In other words, at least 4 main adjustable delay lines need to be designed in the DLL, so as to calibrate the four phase clock signals, resulting in increase of manufacturing cost of a circuit and high-power consumption.

SUMMARY

The present disclosure relates to the technical field of semiconductor memories, and in particular, to a delay-locked loop (DLL), a delay locking method, a clock synchronization circuit, and a memory.

The present disclosure provides a DLL, a delay locking method, a clock synchronization circuit, and a memory. By means of the DLL, the number of adjustable delay lines is decreased, such that the circuit area can be reduced and the power consumption can be reduced, while signal quality is guaranteed.

The technical solutions of the present disclosure are implemented as follow.

According to a first aspect, an embodiment of the present disclosure provides a DLL. The DLL includes a frequency division module, a first adjustable delay line, a delay module, and a latching module.

The frequency division module is configured to receive an input clock signal, perform frequency division on the input clock signal, and output an intermediate clock signal. A clock cycle of the intermediate clock signal is twice the clock cycle of the input clock signal.

The first adjustable delay line is configured to receive the intermediate clock signal, adjust and transmit the intermediate clock signal, and output a synchronous clock signal.

The delay module is configured to receive the input clock signal, perform delay transmission on the input clock signal, and output a sampling clock signal.

The latching module is configured to receive the sampling clock signal and the synchronous clock signal, latch the synchronous clock signal on the basis of the sampling clock signal, and output a group of target clock signals.

In the group of target clock signals, a phase difference between two adjacent target clock signals is a preset value.

In some embodiments, the preset value is 90 degrees. The group of target clock signals includes a first target clock signal, a second target clock signal, a third target clock signal, and a fourth target clock signal. Clock cycles of the first target clock signal, the second target clock signal, the third target clock signal, and the fourth target clock signal are all twice the clock cycle of the input clock signal; and the phase of the first target clock signal is the same as the phase of the synchronous clock signal.

In some embodiments, the sampling clock signal includes a first sampling clock signal and a second sampling clock signal, and the phase of the first sampling clock signal is reverse to the phase of the second sampling clock signal. A clock cycle of the first sampling clock signal is the same as the clock cycle of the input clock signal. A part of a rising edge of the first sampling clock signal aligns with a rising edge of the synchronous clock signal, and the other part of the rising edge of the first sampling clock signal aligns with a falling edge of the synchronous clock signal.

In some embodiments, the delay module includes an adjustable delay link and a phase inverter. The adjustable delay link is configured to receive the input clock signal and an adjustment signal, perform delay transmission on the input clock signal on the basis of the adjustment signal, and output the first sampling clock signal. The phase inverter is configured to receive the first sampling clock signal, and output the second sampling clock signal.

In some embodiments, the latching module is specifically configured to perform the following operations.

The synchronous clock signal is latched by using the first sampling clock signal, and a clock signal to be processed is outputted; the clock signal to be processed is latched by using the second sampling clock signal, and the second target clock signal is outputted; the second target clock signal is latched by using the first sampling clock signal, and the third target clock signal is outputted; the third target clock signal is latched by using the second sampling clock signal, and the fourth target clock signal is outputted; and the fourth target clock signal is latched by using the first sampling clock signal, and the first target clock signal is outputted.

In some embodiments, the latching module includes a first latch, a second latch, a third latch, a fourth latch, and a fifth latch. An input end of the first latch receives the synchronous clock signal, a clock end of the first latch receives the first sampling clock signal, and an output end of the first latch receives the clock signal to be processed. An input end of the second latch receives the clock signal to be processed, a clock end of the second latch receives the second sampling clock signal, and an output end of the second latch outputs the second target clock signal. An input end of the third latch receives the second target clock signal, a clock end of the third latch receives the first sampling clock signal, and an output end of the third latch outputs the third target clock signal. An input end of the fourth latch receives the third target clock signal, a clock end of the fourth latch receives the second sampling clock signal, and an output end of the fourth latch outputs the fourth target clock signal. An input end of the fifth latch receives the fourth target clock signal, a clock end of the fifth latch receives the first sampling clock signal, and an output end of the fifth latch outputs the first target clock signal.

In some embodiments, the DLL further includes a receiving module. The receiving module is configured to externally receive an initial clock signal, and output the input clock signal on the basis of the initial clock signal. A clock cycle of the initial clock signal is the same as that of the input clock signal.

In some embodiments, the DLL further includes a control module. The control module is configured to generate a delay line control signal. The first adjustable delay line is specifically configured to receive the delay line control signal and the intermediate clock signal, adjust and transmit the intermediate clock signal on the basis of the delay line control signal, and output the synchronous clock signal.

In some embodiments, the first target clock signal, the second target clock signal, the third target clock signal, and the fourth target clock signal are configured to perform data sampling after passing through corresponding signal transmission paths. The control module includes a feedback module, a detection module, and a parameter adjustment module.

The feedback module is configured to receive the intermediate clock signal, output an analog clock signal. The analog clock signal is configured to simulate a waveform of the first target clock signal after passing through the signal transmission path. The detection module is configured to receive the intermediate clock signal and the analog clock signal, perform phase detection on the intermediate clock signal and the analog clock signal, and output a phase detection signal. The parameter adjustment module, configured to receive the phase detection signal, and output the delay line control signal on the basis of the phase detection signal.

In some embodiments, the feedback module includes: a second adjustable delay line, configured to receive the delay line control signal and the intermediate clock signal, adjust and transmit the intermediate clock signal on the basis of the delay line control signal, and output a replication clock signal, where the structure of the second adjustable delay line is the same as that of the first adjustable delay line, and the replication clock signal is configured to simulate the waveform of the first target clock signal; and a replication delay module, configured to receive the replication clock signal, delay the replication clock signal, and output the analog clock signal. The replication delay module is at least configured to simulate a time delay of the signal transmission path.

According to a second aspect, an embodiment of the present disclosure provides a delay locking method. The method includes the following operations.

An input clock signal is received, and frequency division is performed on the input clock signal, so as to obtain an intermediate clock signal. A clock cycle of the intermediate clock signal is twice the clock cycle of the input clock signal.

The intermediate clock signal is adjusted and transmitted through a first adjustable delay line, so as to obtain a synchronous clock signal; and delay transmission is performed on the input clock signal, so as to obtain a sampling clock signal.

The synchronous clock signal is latched on the basis of the sampling clock signal, so as to obtain a group of target clock signals. In the group of target clock signals, a phase difference between the two adjacent target clock signals is a preset value.

According to a third aspect, an embodiment of the present disclosure provides a clock synchronization circuit. The clock synchronization circuit includes the DLL as described in the first aspect, and a data selection module. A signal transmission path is arranged between the DLL and the data selection module.

The DLL is configured to: externally receive an initial clock signal, and generate an input clock signal; and output a group of target clock signals on the basis of the input clock signal. A phase difference between the two adjacent target clock signals is a preset value.

The data selection module is configured to receive the group of target clock signals through the signal transmission path, and perform sampling and selective outputting on a data signal by using the group of target clock signals, so as to output a target data signal.

In some embodiments, the DLL is specifically configured to output a first target clock signal, a second target clock signal, a third target clock signal, and a fourth target clock signal on the basis of the input clock signal. Phases among the first target clock signal, the second target clock signal, the third target clock signal, and the fourth target clock signal differ by 90 degrees in turn.

The data selection module is specifically configured to perform sampling and selective outputting on the data signal by using the first target clock signal, the second target clock signal, the third target clock signal, and the fourth target clock signal, so as to obtain the target data signal.

According to a fourth aspect, an embodiment of the present disclosure provides a memory. The memory includes the clock synchronization circuit as described in the third aspect.

In some embodiments, the memory complies with the DDR5 specification.

The embodiments of the present disclosure provide the DLL, the delay locking method, the clock synchronization circuit, and the memory. The DLL includes: the frequency division module, configured to receive the input clock signal, perform frequency division on the input clock signal, and output the intermediate clock signal, where the clock cycle of the intermediate clock signal is twice the clock cycle of the input clock signal; the first adjustable delay line, configured to receive the intermediate clock signal, adjust and transmit the intermediate clock signal, and output the synchronous clock signal; the delay module, configured to receive the input clock signal, perform delay transmission on the input clock signal, and output the sampling clock signal; and the latching module, configured to receive the sampling clock signal and the synchronous clock signal, latch the synchronous clock signal on the basis of the sampling clock signal, and output the group of target clock signals. In the group of target clock signals, the phase difference between the two adjacent target clock signals is the preset value. In this way, by means of the DLL provided in the embodiments of the present disclosure, the number of adjustable delay lines is decreased, such that the circuit area is reduced, and the circuit power consumption of the circuit is also reduced.

DETAILED DESCRIPTION

Figure 1:
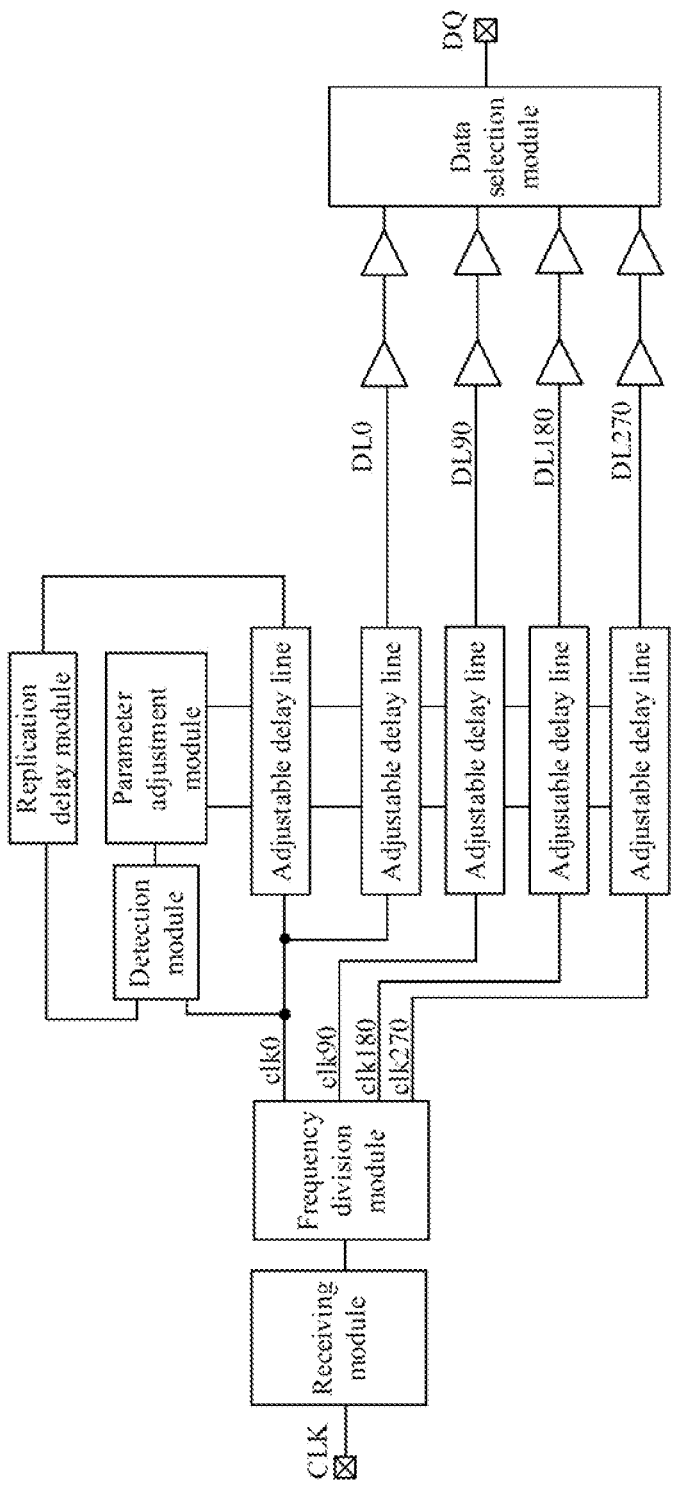
FIG. 1 is a schematic diagram of a structure of a DLL.

The technical solutions in the embodiments of the present disclosure will be clearly and completely described below with reference to the accompanying drawings in the embodiments of the present disclosure. It is to be understood that, the specific embodiments described here are merely used for explaining related applications rather than limiting the present disclosure. In addition, it is further to be noted that, for ease of description, only the parts related to the present disclosure are shown in the drawings. Unless otherwise defined, all technical and scientific terms in the specification have the same meaning as those skilled in the art, belonging to the present disclosure, usually understand. Terms used in the specification are only used for describing the purpose of the present disclosure, but not intended to limit the present disclosure. "Some embodiments" involved in the following descriptions describes a subset of all possible embodiments. However, it can be understood that "some embodiments" may be the same subset or different subsets of all the possible embodiments, and may be combined without conflicts. It is to be noted that, term "first/second/third" involved in the embodiments of the present disclosure is merely used for distinguishing similar objects and does not represent a specific sequence of the objects. It can be understood that "first/second/third" may be interchanged to preset sequences or orders if allowed to implement the embodiments of the present disclosure described herein in turns except the illustrated or described ones.

Dynamic Random Access Memory (DRAM)
Synchronous Dynamic Random Access Memory (SDRAM)
Double Data Rate SDRAM (SDRAMDDR)
Low Power DDR (LPDDR)
DDRn Specification (DDRn), e.g., DDR3, DDR4, DDR5, DDR6
LPDDRn Specification (LPDDRn), e.g., LPDDR3, LPDDR4, LPDDR5, LPDDR6

At present, a memory is gradually moving toward high speed. Taking DDR5 as an example, due to speed acceleration and process limitations, a high-speed clock signal at an interface needs to be internally converted into a low-speed clock signal. For example, a DLL in the memory needs to dynamically adjust the delay of a clock signal and execute delay matching by using a large number of phase inverter chains. At a high-frequency speed, these phase inverter chains cause a large accumulation of signal jitter, which eventually leads to signal loss. Therefore, in order to guarantee signal quality, at a high-frequency speed of the DDR5, an external initial clock signal CLK is divided into four phase clock signals, and the four phase clock signals are respectively sent to the DLL for phase synchronization and locking; and then sampling and selective outputting are performed on a data signal DQ by using the adjusted four phase clock signals through a data selection module (Mux), so as to obtain a target data signal.

Figure 2:
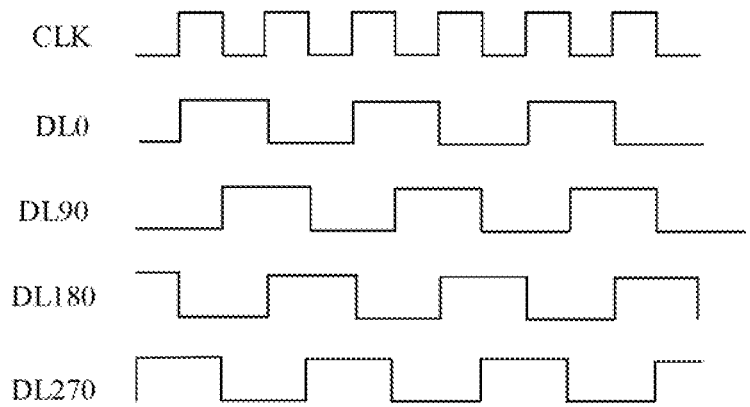
FIG. 2 is a schematic diagram of signal timing of a DLL.

FIG. 1 is a schematic diagram of a structure of a DLL. FIG. 2 is a schematic diagram of signal timing of a DLL. As shown in FIG. 1 and FIG. 2, the initial clock signal CLK enters the DLL by passing through a receiving module, and then are processed by a conversion module into the four phase clock signals (i.e., clk0, clk90, clk180 and clk270), and the frequencies of the four phase clock signals are reduced to half of the initial clock signal CLK. The four phase clock signals are respectively delayed by 4 adjustable delay lines, and adjusted in terms of duty cycles. In this way, after phase locking is performed on the DLL, the adjusted four phase clock signals (i.e., DL0, DL90, DL180 and DL270) are obtained; and the DL0, the DL90, the DL180 and the DL270 are transmitted to a data selection module via corresponding signal transmission paths, so as to realize sampling and selective outputting of the data signal DQ. In addition, the DLL further includes a fifth adjustable delay line, a replication delay module, a detection module, and a parameter adjustment module. The fifth adjustable delay line forms a loop with the replication delay module. The fifth adjustable delay line receives the clock signal clk0. The replication delay module outputs an analog clock signal, and the analog clock signal is configured to indicate a waveform of the adjust clock signal DL0 transmitting to the data selection module. The detection module detects a phase difference between the analog clock signal and the clock signal clk0. The parameter adjustment module outputs a delay line control signal according to a detection result of the detection module; and the delay line control signal is configured to control working parameters of all the adjustable delay lines. In this way, the DLL has a closed-loop feedback mechanism, so as to ensure that the DL0/DL90/DL180/DL270 finally obtained through processing complies with requirements; and the phase of the DL0/DL90/DL180/DL270 differs by 90 degrees in turn.

It can be seen from the above that, the initial clock signal CLK is divided into four paths and then enters the DLL. In order to ensure that rising edge and falling edge information of the initial clock signal CLK is not lost, 4 main adjustable delay lines (and one adjustable delay line for simulation) need to be prepared inside the DLL, to perform phase synchronization and locking on the four phase clock signals, so as to be finally transmitted to the data selection module (Mux). However, such architecture not only increases the area of the DLL, but also consumes great power of the DLL. In an actual working scenario, after the DLL performs phase locking, if a Central Processing Unit (CPU) sends a read command, the 4 main adjustable delay lines continue to work, so as to form an important part of the power consumption of the entire memory. Therefore, it is a difficult task to reduce the power consumption of the DLL while maintaining the signal quality.

Based on this, an embodiment of the present disclosure provides a DLL. The DLL includes: a frequency division module, configured to receive an input clock signal, perform frequency division on the input clock signal, and output an intermediate clock signal, where a clock cycle of the intermediate clock signal is twice the clock cycle of the input clock signal; a first adjustable delay line, configured to receive the intermediate clock signal, adjust and transmit the intermediate clock signal, and output a synchronous clock signal; a delay module, configured to receive the input clock signal, perform delay transmission on the input clock signal, and output a sampling clock signal; and a latching module, configured to receive the sampling clock signal and the synchronous clock signal, latch the synchronous clock signal on the basis of the sampling clock signal, and output a group of target clock signals. In the group of target clock signals, a phase difference between the two adjacent target clock signals is a preset value. In this way, by means of the DLL provided in the embodiments of the present disclosure, the number of adjustable delay lines is decreased, such that circuit areas are decreased, and circuit power consumption is also reduced.

Embodiments of the present disclosure are described in detail below with reference to the drawings.

Figure 3:
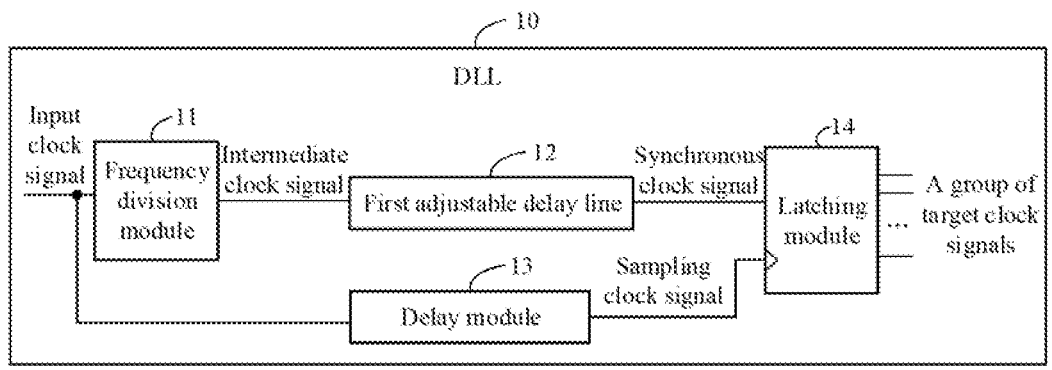
FIG. 3 is a schematic diagram of a structure of a DLL according to an embodiment of the present disclosure.

In an embodiment of the present disclosure, FIG. 3 is a schematic structural diagram of a DLL 10 according to an embodiment of the present disclosure. As shown in FIG. 3, the DLL 10 includes the frequency division module, the frequency division module, the delay module, and the latching module.

The frequency division module 11 is configured to receive an input clock signal, perform frequency division on the input clock signal, and output an intermediate clock signal. The clock cycle of the intermediate clock signal is twice the clock cycle of the input clock signal.

The first adjustable delay line 12 is configured to receive the intermediate clock signal, adjust and transmit the intermediate clock signal, and output a synchronous clock signal.

The delay module 13 is configured to receive the input clock signal, perform delay transmission on the input clock signal, and output a sampling clock signal.

The latching module 14 is configured to receive the sampling clock signal and the synchronous clock signal, latch the synchronous clock signal on the basis of the sampling clock signal, and output a group of target clock signals. In the group of target clock signals, the phase difference between two adjacent target clock signals is the preset value.

It is to be noted that, the DLL 10 of this embodiment of the present disclosure may be applied to, but is not limited to, a memory such as a DRAM and an SDRAM. In addition, in other analog circuits/digital circuits, the DLL 10 provided in this embodiment of the present disclosure may be used to generate a group of clock signals with different phases.

In the DLL 10, the intermediate clock signal is adjusted and transmitted by the first adjustable delay line 12, so as to generate the synchronous clock signal; delay transmission is performed on the input clock signal by the delay module 13, so as to generate the sampling clock signal; and the synchronous clock signal is subsequently latched by using the sampling clock signal through the latching module 14, so as to generate the group of target clock signals of which phase difference between adjacent signals is the preset value. In this way, the number of the adjustable delay lines in the DLL 10 is obviously reduced, such that the circuit area is reduced, and the manufacturing cost of a circuit is reduced. Reduction in current and power consumption may further lead to improvement in phase error caused by mismatched delay lines, so as to guarantee the signal quality.

It is to be understood that, there is a certain error allowed for the limitation of the phase difference in this embodiment of the present disclosure. That is to say, in the group of target clock signals, the phase difference between two adjacent target clock signals is the preset value within an allowable error range. Subsequent relevant limitations regarding phase values, clock cycles, signal alignment, or signal waveforms being identical are all referred to within the allowable error range.

It is to be noted that, according to different actual application requirements, the number M of signals in the group of target clock signals may be determined according to an actual application scenario, and the preset value=360 degrees/M. For example, M=2, the current preset value is 180 degrees, and the group of target clock signals includes a first target clock signal and a second target clock signal; for another example, M=4, the current preset value is 90 degrees, and the group of target clock signals includes the first target clock signal, the second target clock signal, a third target clock signal, and a fourth target clock signal.

Descriptions below all use the group of target clock signals including the first target clock signal (which is represented as DL0 below), the second target clock signal (which is represented as DL90 below), the third target clock signal (which is represented as DL180 below), and the fourth target clock signal (which is represented as DL270 below) as an example, and other cases may be understood with reference.

Figure 4:
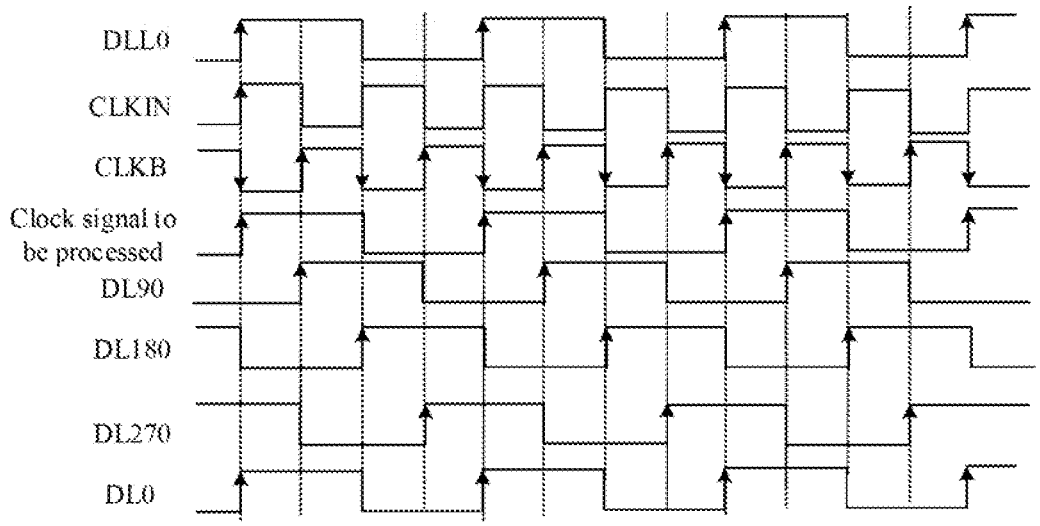
FIG. 4 is a schematic diagram of signal timing of a DLL according to an embodiment of the present disclosure.

FIG. 4 is a schematic diagram of signal timing a DLL according to an embodiment of the present disclosure. As shown in FIG. 4, clock cycles of the first target clock signal DL0, the second target clock signal DL90, the third target clock signal DL180, and the fourth target clock signal DL270 are all twice the clock cycle of the input clock signal; and the phase of the first target clock signal DL0 is the same as the phase of the synchronous clock signal DLL0.

In some embodiments, as shown in FIG. 4, the sampling clock signal includes a first sampling clock signal CLKIN and a second sampling clock signal CLKB, and the phase of the first sampling clock signal CLKIN is reverse to the phase of the second sampling clock signal CLKB. The clock cycle of the first sampling clock signal CLKIN is the same as the clock cycle of the input clock signal, that is, the clock cycle of the first sampling clock signal CLKIN is half of the clock cycle of the synchronous clock signal DLL0. A part of a rising edge of the first sampling clock signal CLKIN aligns with a rising edge of the synchronous clock signal DLL0, and the other part of the rising edge of the first sampling clock signal CLKIN aligns with a falling edge of the synchronous clock signal DLL0.

It is to be understood that, there is a certain error allowed for "alignment" in this embodiment of the present disclosure. That is to say, a part of the rising edge of the first sampling clock signal CLKIN aligns with the rising edge of the synchronous clock signal DLL0 within the allowable error range, and the other part of the rising edge of the first sampling clock signal CLKIN aligns with the falling edge of the synchronous clock signal DLL0 within the allowable error range.

In this way, the first sampling clock signal CLKIN and the second sampling clock signal CLKB are used in turn to latch the synchronous clock signal DLL0, so as to obtain the group of target clock signals of which phase differences are 90 degrees in sequence.

Figure 5:
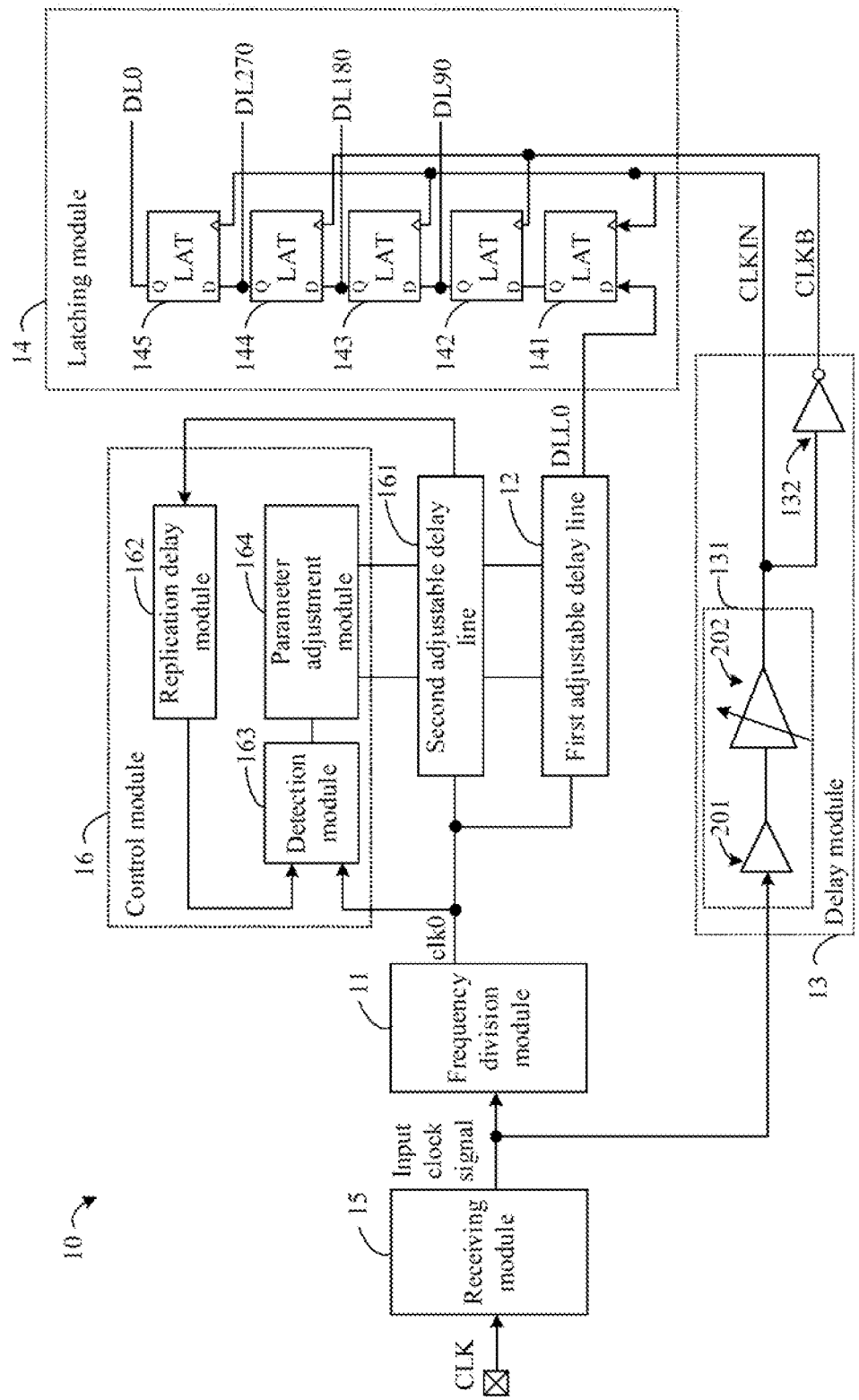
FIG. 5 is a schematic diagram of a detailed structure of a DLL according to an embodiment of the present disclosure.

In some embodiments, FIG. 5 is a schematic diagram of a detailed structure of a DLL 10 according to an embodiment of the present disclosure. As shown in FIG. 5, the DLL 10 further includes a receiving module 15.

The receiving module 15 is configured to externally receive an initial clock signal CLK, and output the input clock signal on the basis of the initial clock signal CLK. A clock cycle of the initial clock signal CLK is the same as that of the input clock signal.

It is to be noted that, the initial clock signal CLK may be a pair of differential signals; and the input clock signal is a single-ended signal, so as to guarantee the accuracy in signal reception and better stability of the input clock signal.

In some embodiments, as shown in FIG. 5, the delay module 13 includes an adjustable delay link 131 and a phase inverter 132.

The adjustable delay link 131 is configured to receive the input clock signal and an adjustment signal, perform delay transmission on the input clock signal on the basis of the adjustment signal, and output the first sampling clock signal CLKIN.

The phase inverter 132 is configured to receive the first sampling clock signal CLKIN, and output the second sampling clock signal CLKB.

It is to be noted that, the adjustable delay link 131 may include a buffer 201 and an adjustable cell 202. Herein, only one buffer 201 is shown in FIG. 5, but there may be more buffers. The adjustable cell 202 consists of a plurality of delay cells connected in series. Adjustment parameters may control working parameters of the adjustable cell 202, so as to generate delay of different degrees for an input signal, such that it is finally ensured that "the rising edge of the first sampling clock signal CLKIN" aligns with the "rising edge or the falling edge of the synchronous clock signal DLL0" within the allowable error range.

Herein, the adjustment parameters may be determined by a feedback adjustment mechanism. That is to say, the adjustable delay link 131 further includes a parameter module. The parameter module can perform a logical operation on the first sampling clock signal CLKIN and the synchronous clock signal DLL0, and adjust the adjustment parameters in real time according to an operation result.

In some embodiments, the latching module 14 is specifically configured to: latch the synchronous clock signal DLL0 by using the first sampling clock signal CLKIN, and output a clock signal to be processed; latch, by using the second sampling clock signal CLKB, the clock signal to be processed, and output the second target clock signal DL90; latch the second target clock signal DL90 by using the first sampling clock signal CLKIN, and output the third target clock signal DL180; latch the third target clock signal DL180 by using the second sampling clock signal CLKB, and output the fourth target clock signal DL270; and latch the fourth target clock signal DL270 by using the first sampling clock signal CLKIN, and output the first target clock signal DL0.

In a specific embodiment, as shown in FIG. 5, the latching module 14 includes a first latch 141, a second latch 142, a third latch 143, a fourth latch 144, and a fifth latch 145. An input end of the first latch 141 receives the synchronous clock signal DLL0, a clock end of the first latch 141 receives the first sampling clock signal CLKIN, and an output end of the first latch 141 receives the clock signal to be processed. An input end of the second latch 142 receives the clock signal to be processed, a clock end of the second latch 142 receives the second sampling clock signal CLKB, and an output end of the second latch 142 outputs the second target clock signal DL90. An input end of the third latch 143 receives the second target clock signal DL90, a clock end of the third latch 143 receives the first sampling clock signal CLKIN, and an output end of the third latch 143 outputs the third target clock signal DL180. An input end of the fourth latch 144 receives the third target clock signal DL180, a clock end of the fourth latch 144 receives the second sampling clock signal CLKB, and an output end of the fourth latch 144 outputs the fourth target clock signal DL270. An input end of the fifth latch 145 receives the fourth target clock signal DL270, a clock end of the fifth latch 145 receives the first sampling clock signal CLKIN, and an output end of the fifth latch 145 outputs the first target clock signal DL0.

It is to be noted that, the working principles of the first latch 141, the second latch 142, the third latch 143, the fourth latch 144, and the fifth latch 145 are the same. Specifically, if the signal of the clock end is at a high level, the state of the signal of the output end varies with the state of the signal of the input end; and if the signal of the clock end is at a low level, the state of the signal of the output end remains unchanged.

Specifically, as shown in FIG. 4, as for the first latch 141, if the first sampling clock signal CLKIN is at a high level, the level state of the clock signal to be processed is the same as that of the synchronous clock signal DLL0; and if the first sampling clock signal CLKIN is at a low level, the level state of the clock signal to be processed remains unchanged. Therefore, as shown in FIG. 4, the waveform of the clock signal to be processed is the same as the waveform of the synchronous clock signal DLL0 within the allowable error range. As for the second latch 142, if the second sampling clock signal CLKB is at a high level, the level state of the second target clock signal DL90 is the same as that of the clock signal to be processed within the allowable error range; and if the second sampling clock signal CLKB is at a low level, the level state of the second target clock signal DL90 remains unchanged. Therefore, as shown in FIG. 4, compared with the clock signal to be processed, the second target clock signal DL90 is delayed by 90 degrees within the allowable error range. As for the third latch 143, if the first sampling clock signal CLKIN is at a high level, the level state of the third target clock signal DL180 is the same as that of the second target clock signal DL90 within the allowable error range; and if the first sampling clock signal CLKIN is at a low level, the level state of the third target clock signal DL180 remains unchanged. Therefore, as shown in FIG. 4, compared with the second target clock signal DL90, the phase of the third target clock signal DL180 is delayed by 90 degrees within the allowable error range. As for the fourth latch 144, if the second sampling clock signal CLKB is at a high level, the level state of the fourth target clock signal DL270 is the same as that of the third target clock signal DL180; and if the second sampling clock signal CLKB is at a low level, the level state of the fourth target clock signal DL270 remains unchanged. Therefore, as shown in FIG. 4, compared with the third target clock signal DL180, the fourth target clock signal DL270 is delayed by 90 degrees in phase within the allowable error range. As for the fifth latch 145, if the first sampling clock signal CLKIN is at a high level, the level state of the first target clock signal DL0 is the same as that of the fourth target clock signal DL270 within the allowable error range; and if the first sampling clock signal CLKIN is at a low level, the level state of the first target clock signal DL0 remains unchanged. Therefore, as shown in FIG. 4, compared with the fourth target clock signal DL270, the first target clock signal DL0 is delayed by 90 degrees in phase within the allowable error range; in other words, compared with the second target clock signal DL90, the first target clock signal DL0 is 90 degrees ahead in phase within the allowable error range.

That is to say, the second latch 142, the third latch 143, the fourth latch 144, and the fifth latch 145 integrally form a four-frequency-division shift register. For the DLL 10, only the intermediate clock signal clk0 after frequency division is sent to the first adjustable delay line 12. The synchronous clock signal DLL0 (which is outputted by the first adjustable delay line 12) is latched by using the shift register, such that 4 target clock signals of which phase differences differ by 90 degrees in turn can be generated. In this way, only one main adjustable delay line is required to be disposed in the DLL 10, such that three adjustable delay lines are saved, thereby greatly reducing energy consumption of the DLL 10.

In particular, when the latching module 14 includes the first latch 141, the second latch 142, the third latch 143, the fourth latch 144, and the fifth latch 145, better delay matching can be achieved among the first target clock signal DL0, the second target clock signal DL90, the third target clock signal DL180 and the fourth target clock signal DL270, and the phase difference between each other is relatively small. In addition, the fifth latch 145 may be removed; the first target clock signal DL0 is formed after delay transmission is performed on the synchronous clock signal DLL0 outputted by the first adjustable delay line 12; or the synchronous clock signal DLL0 outputted by the first latch 141 is determined as the first target clock signal DL0. These solutions are also within the scope of protection of the present disclosure.

In some embodiments, as shown in FIG. 5, the DLL 10 further includes a control module 16.

The control module 16 is configured to generate a delay line control signal.

The first adjustable delay line 12 is specifically configured to receive the delay line control signal and the intermediate clock signal clk0, adjust and transmit the intermediate clock signal clk0 on the basis of the delay line control signal, and output the synchronous clock signal DLL0.

In this way, on the basis of the delay line control signal, the first adjustable delay line 12 adjusts the intermediate clock signal clk0 in a plurality of aspects, so as to ensure that the duty cycle and phase of the synchronous clock signal DLL0 comply with requirements, such that the first target clock signal DL0, the second target clock signal DL90, the third target clock signal DL180, and the fourth target clock signal DL270 that are generated by using the synchronous clock signal DLL0 also comply with the requirements.

Figure 6:
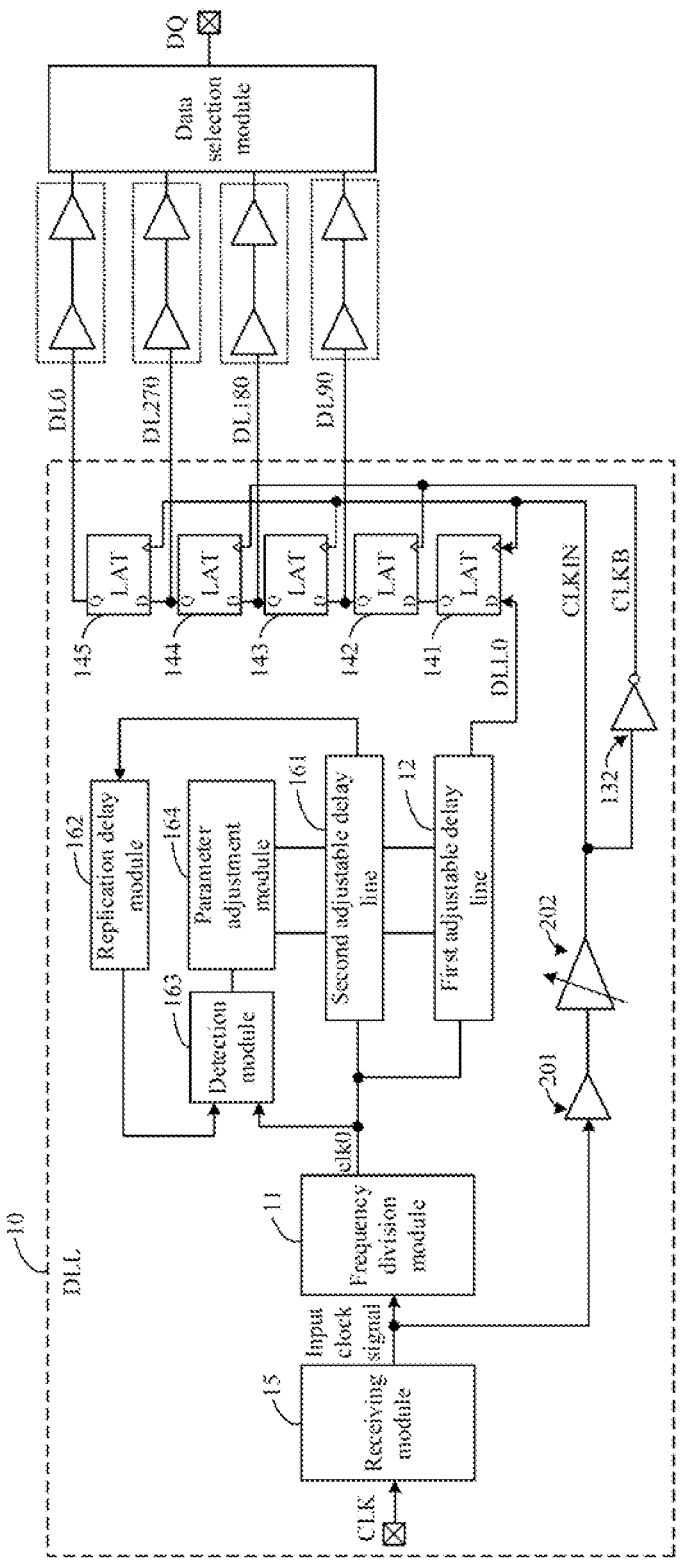
FIG. 6 is a schematic diagram of an application scenario of a DLL according to an embodiment of the present disclosure.

It is to be noted that, FIG. 6 is a schematic diagram of an application scenario of a DLL 10 according to an embodiment of the present disclosure. As shown in FIG. 6, the first target clock signal DL0, the second target clock signal DL90, the third target clock signal DL180, and the fourth target clock signal DL270 are configured to perform data sampling after passing through corresponding signal transmission paths (specifically referring to a dashed box at an input end of a data selection module in FIG. 6). Specifically, the first target clock signal DL0, the second target clock signal DL90, the third target clock signal DL180, and the fourth target clock signal DL270 reach the data selection module (Mux) after passing through the corresponding signal transmission paths; and the data selection module uses a four-phase target clock signal to perform sampling and selective outputting on a data signal DQ, so as to output a target data signal.

Herein, a certain number of buffers may be provided on each signal transmission path, so as to improve the driving capability for the signal, and the number of the buffers is the same for on the four signal transmission paths.

In some embodiments, as shown in FIG. 5 or FIG. 6, the control module 16 includes a feedback module, a detection module, and a parameter adjustment module.

The feedback module (which is specifically a signal link formed by a second adjustable delay line 161 and a replication delay module 162, details referring to the following description) is configured to receive the intermediate clock signal clk0, and output an analog clock signal. The analog clock signal is configured to simulate a waveform of the first target clock signal DL0 after passing through the signal transmission path.

The detection module 163 is configured to receive the intermediate clock signal clk0 and the analog clock signal, perform phase detection on the intermediate clock signal clk0 and the analog clock signal, and output a phase detection signal.

The parameter adjustment module 164 is configured to receive the phase detection signal, and output the delay line control signal on the basis of the phase detection signal.

It is to be noted that, the waveform of the first target clock signal DL0 when reaching the data selection module needs to keep consistent with the waveform of the intermediate clock signal clk0, such that a feedback adjustment mechanism needs to be constructed. Specifically, an analog clock signal is generated after the intermediate clock signal clk0 passes through the feedback module. Since the analog clock signal can simulate the waveform of the first target clock signal DL0 when reaching the data selection module, the delay line control signal is adjusted according to the difference between the analog clock signal and the intermediate clock signal clk0, so as to adjust working parameters of the first adjustable delay line.

In addition, the waveform of the analog clock signal is not exactly the same as the waveform of the first target clock signal DL0 after passing through the signal transmission path. In an actual working scenario, after a memory enters a stable working state, frequency division may be performed on the analog clock signal, so as to reduce update frequency of the delay line control signal, thereby avoiding signal jitter caused by signal burrs, and simultaneously reducing power consumption.

In a specific embodiment, as shown in FIG. 6, the feedback module includes the second adjustable delay line and the replication delay module.

The second adjustable delay line 161 is configured to receive the delay line control signal and the intermediate clock signal clk0, adjust and transmit the intermediate clock signal clk0 on the basis of the delay line control signal, and output a replication clock signal. The structure of the second adjustable delay line 161 is the same as that of the first adjustable delay line 12; and the replication clock signal is configured to simulate the waveform of the first target clock signal DL0.

The replication delay module 162 is configured to receive the replication clock signal, delay the replication clock signal, and output the analog clock signal. The replication delay module 162 is at least configured to simulate a time delay of the signal transmission path.

In this way, the second adjustable delay line 161 is configured to replicate a processing process of the first adjustable delay line 12. The replication delay module 162 is configured to replicate, but not limited to, a time delay when the first target clock signal DL0 is transmitted by the signal transmission path, so as to form a closed loop of feedback adjustment.

To sum up, for a high-speed memory, this embodiment of the present disclosure provides a brand-new structure of the DLL. The delay module 13 and the latching module 14 are introduced in the DLL 10; only the intermediate clock signal clk0 after frequency division is sent in the adjustable delay line; and the synchronous clock signal DLL0 outputted by the adjustable delay line is processed by using the delay module 13 and the latching module 14, so as to obtain the group of target clock signals in which the phase difference of the adjacent signals is the preset value. In this way, insofar as signal quality is guaranteed, only one main adjustable delay line (an adjustable delay line for simulation being additionally included) needs to be provided on the DLL, such that three adjustable delay lines are saved, thereby decreasing circuit areas, reducing the manufacturing costs of a circuit, and reducing power consumption.

Figure 7:
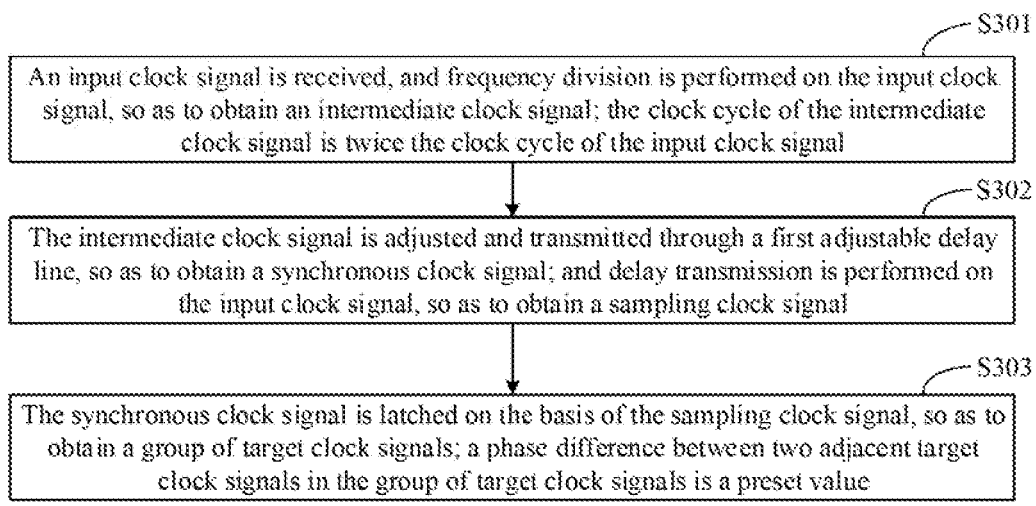
FIG. 7 is a schematic flowchart of a delay locking method according to an embodiment of the present disclosure.

In another embodiment of the present disclosure, FIG. 7 is a schematic flowchart of a delay locking method according to an embodiment of the present disclosure. As shown in FIG. 7, the method includes the following steps.

At S301, an input clock signal is received, and frequency division is performed on the input clock signal, so as to obtain an intermediate clock signal. The clock cycle of the intermediate clock signal is twice the clock cycle of the input clock signal.

It is to be noted that, the delay locking method provided in this embodiment of the present disclosure is applied to the foregoing DLL 10.

At S302, the intermediate clock signal is adjusted and transmitted through a first adjustable delay line, so as to obtain a synchronous clock signal, and delay transmission is performed on the input clock signal, so as to obtain a sampling clock signal.

At S303, the synchronous clock signal is latched on the basis of the sampling clock signal, so as to obtain a group of target clock signals. In the group of target clock signals, a phase difference between two adjacent target clock signals is a preset value.

In this way, insofar as signal quality is guaranteed, the group of target clock signals in which phase difference between the adjacent signals is the preset value may be generated by only providing one main adjustable delay line, such that three adjustable delay lines are saved, thereby decreasing circuit areas, reducing the manufacturing costs of a circuit, and reducing power consumption.

In some embodiments, the preset value is 90 degrees. The group of target clock signals includes a first target clock signal, a second target clock signal, a third target clock signal, and a fourth target clock signal. Clock cycles of the first target clock signal, the second target clock signal, the third target clock signal, and the fourth target clock signal are all twice the clock cycle of the input clock signal; and the phase of the first target clock signal is the same as the phase of the synchronous clock signal.

In some embodiments, the sampling clock signal includes a first sampling clock signal and a second sampling clock signal, and the phase of the first sampling clock signal is reverse to the phase of the second sampling clock signal. The clock cycle of the first sampling clock signal is the same as the clock cycle of the input clock signal. A rising edge of the first sampling clock signal aligns with a rising edge or falling edge of the synchronous clock signal.

In some embodiments, the step of performing delay transmission on the initial clock signal and outputting the sampling clock signal includes the following operations.

An adjustment signal is determined, and delay transmission is performed on the input clock signal on the basis of the adjustment signal, so as to output the first sampling clock signal; and phase reverse is performed on the first sampling clock signal, so as to output the second sampling clock signal.

In some embodiments, the step of latching the synchronous clock signal on the basis of the sampling clock signal, and outputting a plurality of target clock signals includes the following operations.

The synchronous clock signal is latched by using the first sampling clock signal, and a clock signal to be processed is outputted; the clock signal to be processed is latched by using the second sampling clock signal, and the second target clock signal is outputted; the second target clock signal is sampled by using the first sampling clock signal, and the third target clock signal is outputted; the third target clock signal is sampled by using the second sampling clock signal, and the fourth target clock signal is outputted; and the fourth target clock signal is sampled by using the first sampling clock signal, and the first target clock signal is obtained.

This embodiment of the present disclosure provides the delay locking method. Insofar as the signal quality is guaranteed, the number of the adjustable delay lines is reduced, such that the circuit area is reduced, the manufacturing costs of a circuit are reduced, and power consumption is reduced.

Figure 8:
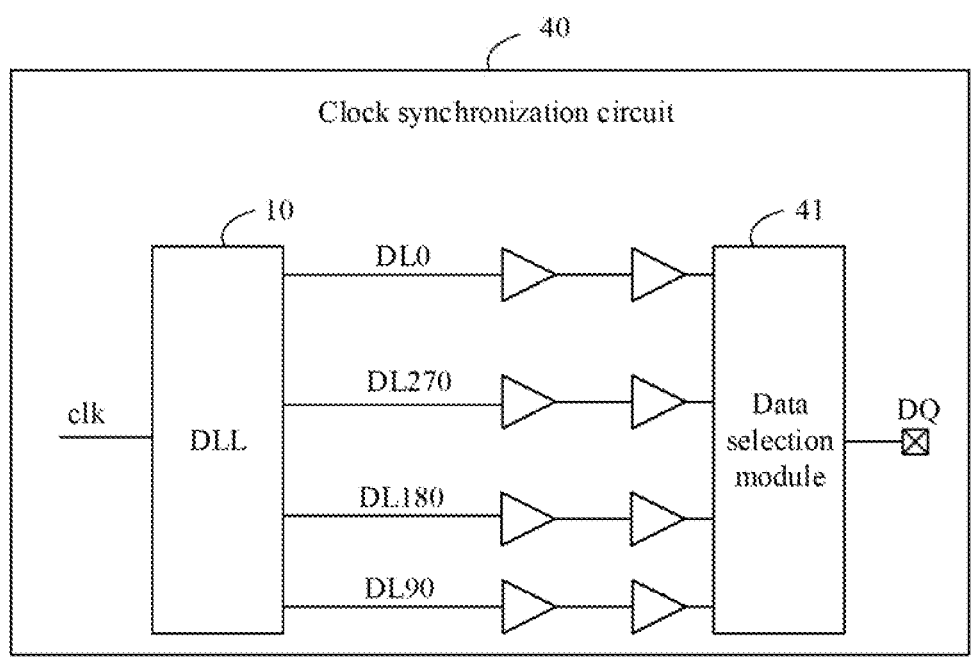
FIG. 8 is a schematic diagram of a structure of a clock synchronization circuit according to an embodiment of the present disclosure.

In still another embodiment of the present disclosure, FIG. 8 is a schematic diagram of a structure of a clock synchronization circuit 40 according to an embodiment of the present disclosure. As shown in FIG. 8, the clock synchronization circuit 40 includes the foregoing DLL 10 and a data selection module 41. A signal transmission path is arranged between the DLL 10 and the data selection module 41.

The DLL 10 is configured to: externally receive an initial clock signal clk0, and generate an input clock signal; and output a group of target clock signals (e.g., DL0, DL90, DL180, DL270 in FIG. 4) on the basis of the input clock signal. A phase difference between two adjacent target clock signals is a preset value.

The data selection module 41 is configured to receive the group of target clock signals through the signal transmission path, and perform sampling and selective outputting on a data signal DQ by using the group of target clock signals, so as to output a target data signal.

It is to be noted that, the structure of the DLL 10 refers to descriptions. The intermediate clock signal is adjusted and transmitted by the first adjustable delay line 12, so as to generate the synchronous clock signal; delay transmission is performed on the input clock signal by the delay module 13, so as to generate the sampling clock signal; and the synchronous clock signal is subsequently latched by using the sampling clock signal through the latching module 14, so as to generate the group of target clock signals of which phase difference between the adjacent signals is the preset value. In this way, the number of the adjustable delay lines in the DLL 10 is reduced significantly, such that the circuit area is reduced, and the manufacturing costs of a circuit are reduced. Reducing current and power consumption may further improve a phase error caused by mismatched delay lines, so as to guarantee the signal quality.

In some embodiments, the DLL 10 is specifically configured to output a first target clock signal DL0, a second target clock signal DL90, a third target clock signal DL180, and a fourth target clock signal DL270 on the basis of the input clock signal. Phases among the first target clock signal DL0, the second target clock signal DL90, the third target clock signal DL180, and the fourth target clock signal DL270 differ by 90 degrees in turn.

The data selection module 41 is specifically configured to perform sampling and selective outputting on the data signal by using the first target clock signal DL0, the second target clock signal DL90, the third target clock signal DL180, and the fourth target clock signal DL270, so as to obtain the target data signal.

It is to be noted that, as shown in FIG. 8, there are 4 signal transmission paths, which are respectively configured to transmit the first target clock signal DL0, the second target clock signal DL90, the third target clock signal DL180, and the fourth target clock signal DL270. For the 4 signal transmission paths, each signal transmission path is provided with the same number of buffers, so as to achieve effects of signal delay and driving enhancement. In FIG. 8, for example, each signal transmission path is provided with 2 buffers, but more buffers or less buffers may be used during actual applications.

In this way, insofar as the signal quality is guaranteed, the number of the adjustable delay lines is reduced, such that the circuit area is reduced, the manufacturing costs of a circuit are reduced, and power consumption is reduced.

Figure 9:
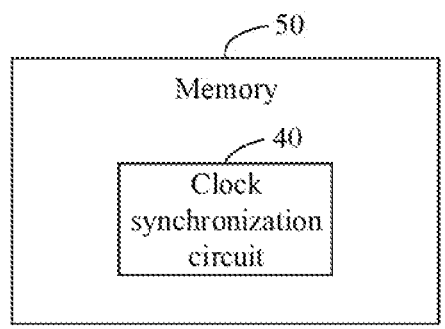
FIG. 9 is a schematic diagram of a structure of a memory according to an embodiment of the present disclosure.

In yet another embodiment of the present disclosure, FIG. 9 is a schematic diagram of a composition structure of a memory 50 according to an embodiment of the present disclosure. As shown in FIG. 9, the memory 50 at least includes the foregoing clock synchronization circuit 40.

It is to be noted that, since the clock synchronization circuit 40 includes the foregoing DLL 10, the intermediate clock signal clk0 is adjusted and transmitted only by the first adjustable delay line 12, so as to generate the synchronous clock signal DLL0; and processing is performed by using the delay module 13 and the latching module 14, so as to obtain the group of target clock signals of which phase difference between adjacent signals is the preset value. In this way, insofar as signal quality is guaranteed, only one main adjustable delay line needs to be provided on the DLL in the memory 50, such that three adjustable delay lines are saved, thereby decreasing the circuit area, reducing the manufacturing costs of the circuit, and reducing power consumption.

In some embodiments, the memory complies with at least one of the following specifications: DDR3, DDR4, DDR5, DDR6, LPDDR3, LPDDR4, LPDDR5, or LPDDR6.

In this way, in this embodiment of the present disclosure, the architecture of FIG. 3, FIG. 5 or FIG. 6 is used to generate a 4-phase clock signal, such that the signal quality is guaranteed, and areas and power consumption may further be reduced. Since the speed of the initial clock signal in the DDR5 is very fast, purposes can be achieved when a delay line is very short. Compared with a traditional architecture, power consumption can be reduced by almost half.

The above descriptions are merely some embodiments of the present disclosure, and are not intended to limit the protection scope of the present disclosure. It is to be noted that terms "include" and "comprise" or any other variant thereof is intended to cover nonexclusive inclusions herein, such that a process, method, object or apparatus including a series of components not only includes those components but also includes other components which are not clearly listed or further includes components intrinsic to the process, the method, the object or the apparatus. Under the condition of no more limitations, a component defined by the statement "including a/an" does not exclude existence of the same other components in a process, method, object or apparatus including the component. The serial numbers of the foregoing embodiments of the present disclosure are merely for description, and do not represent the superiority or inferiority of the embodiments. The methods disclosed in several method embodiments provided by the present disclosure can be combined arbitrarily without conflict to obtain a new method embodiment. The characteristics disclosed in several product embodiments provided in the present disclosure can be combined arbitrarily without conflict to obtain a new product embodiment. The characteristics disclosed in several method or device embodiments provided in the present disclosure can be combined arbitrarily without conflict to obtain a new method embodiment or device embodiment. The above is only the specific implementations of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

INDUSTRIAL APPLICABILITY

The embodiments of the present disclosure provide a DLL, a delay locking method, a clock synchronization circuit, and a memory. The DLL includes: the frequency division module, configured to receive the input clock signal, perform frequency division on the input clock signal, and output the intermediate clock signal, where the clock cycle of the intermediate clock signal is twice the clock cycle of the input clock signal; the first adjustable delay line, configured to receive the intermediate clock signal, adjust and transmit the intermediate clock signal, and output the synchronous clock signal; the delay module, configured to receive the input clock signal, perform delay transmission on the input clock signal, and output the sampling clock signal; and the latching module, configured to receive the sampling clock signal and the synchronous clock signal, latch the synchronous clock signal on the basis of the sampling clock signal, and output the group of target clock signals. In the group of target clock signals, the phase difference between the two adjacent target clock signals is the preset value. In this way, by means of the DLL provided in the embodiments of the present disclosure, the number of adjustable delay lines is decreased, such that the circuit area is reduced, and circuit power consumption is also reduced.

What is claimed is:

1. A delay-locked loop, comprising:
   a frequency division module, configured to receive an input clock signal, perform frequency division on the input clock signal, and output an intermediate clock signal, wherein a clock cycle of the intermediate clock signal is twice a clock cycle of the input clock signal;
   a first adjustable delay line, configured to receive the intermediate clock signal, adjust and transmit the intermediate clock signal, and output a synchronous clock signal;
   a delay module, configured to receive the input clock signal, perform delay transmission on the input clock signal, and output a sampling clock signal; and
   a latching module, configured to receive the sampling clock signal and the synchronous clock signal, latch the synchronous clock signal on the basis of the sampling clock signal, and output a group of target clock signals;
   a receiving module, wherein the receiving module is configured to externally receive an initial clock signal, and output the input clock signal on the basis of the initial clock signal, wherein a clock cycle of the initial clock signal is the same as the clock cycle of the input clock signal;
   wherein, a phase difference between two adjacent target clock signals in the group of target clock signals is a preset value;
   wherein the preset value is 90 degrees;
   the group of target clock signals comprises a first target clock signal, a second target clock signal, a third target clock signal and a fourth target clock signal;
   clock cycles of the first target clock signal, the second target clock signal, the third target clock signal and the fourth target clock signal are all twice a clock cycle of the input clock signal; and the phase of the first target clock signal is the same as the phase of the synchronous clock signal.

2. The delay-locked loop of claim 1, wherein the sampling clock signal comprises a first sampling clock signal and a second sampling clock signal, and the phase of the first sampling clock signal is reverse to the phase of the second sampling clock signal;
   a clock cycle of the first sampling clock signal is the same as the clock cycle of the input clock signal; a part of a rising edge of the first sampling clock signal aligns with a rising edge of the synchronous clock signal; and the other part of the rising edge of the first sampling clock signal aligns with a falling edge of the synchronous clock signal.

3. The delay-locked loop of claim 2, wherein the delay module comprises an adjustable delay link and a phase inverter;
the adjustable delay link is configured to receive the input clock signal and an adjustment signal, perform delay transmission on the input clock signal on the basis of the adjustment signal, and output the first sampling clock signal;
the phase inverter is configured to receive the first sampling clock signal, and output the second sampling clock signal.

4. The delay-locked loop of claim 2, wherein the latching module is specifically configured to:
latch the synchronous clock signal by using the first sampling clock signal, and output a clock signal to be processed;
latch, by using the second sampling clock signal, the clock signal to be processed, and output the second target clock signal;
latch the second target clock signal by using the first sampling clock signal, and output the third target clock signal;
latch the third target clock signal by using the second sampling clock signal, and output the fourth target clock signal; and
latch the fourth target clock signal by using the first sampling clock signal, and output the first target clock signal.

5. The delay-locked loop of claim 4, wherein
the latching module comprises a first latch, a second latch, a third latch, a fourth latch, and a fifth latch;
an input end of the first latch receives the synchronous clock signal, a clock end of the first latch receives the first sampling clock signal, and an output end of the first latch receives the clock signal to be processed;
an input end of the second latch receives the clock signal to be processed, a clock end of the second latch receives the second sampling clock signal, and an output end of the second latch outputs the second target clock signal;
an input end of the third latch receives the second target clock signal, a clock end of the third latch receives the first sampling clock signal, and an output end of the third latch outputs the third target clock signal;
an input end of the fourth latch receives the third target clock signal, a clock end of the fourth latch receives the second sampling clock signal, and an output end of the fourth latch outputs the fourth target clock signal;
an input end of the fifth latch receives the fourth target clock signal, a clock end of the fifth latch receives the first sampling clock signal, and an output end of the fifth latch outputs the first target clock signal.

6. The delay-locked loop of claim 1, further comprising a control module, wherein
the control module is configured to generate a delay line control signal;
the first adjustable delay line is specifically configured to receive the delay line control signal and the intermediate clock signal, adjust and transmit the intermediate clock signal on the basis of the delay line control signal, and output the synchronous clock signal.

7. The delay-locked loop of claim 6, wherein the first target clock signal, the second target clock signal, the third target clock signal, and the fourth target clock signal are configured to perform data sampling after passing through corresponding signal transmission paths;
the control module comprises:
a feedback module, configured to receive the intermediate clock signal, output an analog clock signal, wherein the analog clock signal is configured to simulate a waveform of the first target clock signal after passing through a signal transmission path;
a detection module, configured to receive the intermediate clock signal and the analog clock signal, perform phase detection on the intermediate clock signal and the analog clock signal, and output a phase detection signal;
a parameter adjustment module, configured to receive the phase detection signal, and output the delay line control signal on the basis of the phase detection signal.

8. The delay-locked loop of claim 7, wherein the feedback module comprises:
a second adjustable delay line, configured to receive the delay line control signal and the intermediate clock signal, adjust and transmit the intermediate clock signal on the basis of the delay line control signal, and output a replication clock signal, wherein a structure of the second adjustable delay line is the same as a structure of the first adjustable delay line, and the replication clock signal is configured to simulate the waveform of the first target clock signal;
a replication delay module, configured to receive the replication clock signal, delay the replication clock signal, and output the analog clock signal, wherein the replication delay module is at least configured to simulate a time delay of the signal transmission path.

9. A delay locking method, comprising:
receiving an initial clock signal externally and outputting an input clock signal on the basis of the initial clock signal, wherein a clock cycle of the initial clock signal is the same as the clock cycle of the input clock signal;
receiving the input clock signal and performing frequency division on the input clock signal to obtain an intermediate clock signal, wherein a clock cycle of the intermediate clock signal is twice a clock cycle of the input clock signal;
adjusting and transmitting the intermediate clock signal through a first adjustable delay line to obtain a synchronous clock signal, and performing delay transmission on the input clock signal to obtain a sampling clock signal; and
latching the synchronous clock signal on the basis of the sampling clock signal to obtain a group of target clock signals, wherein a phase difference between two adjacent target clock signals in the group of target clock signals is a preset value.

10. A clock synchronization circuit, comprising a delay-locked loop and a data selection module, wherein a signal transmission path is arranged between the delay-locked loop and the data selection module;
wherein the delay-locked loop comprises:
a frequency division module, configured to receive an input clock signal, perform frequency division on the input clock signal, and output an intermediate clock signal, wherein a clock cycle of the intermediate clock signal is twice a clock cycle of the input clock signal;

a first adjustable delay line, configured to receive the intermediate clock signal, adjust and transmit the intermediate clock signal, and output a synchronous clock signal;

a delay module, configured to receive the input clock signal, perform delay transmission on the input clock signal, and output a sampling clock signal; and a latching module, configured to receive the sampling clock signal and the synchronous clock signal, latch the synchronous clock signal on the basis of the sampling clock signal, and output a group of target clock signals;

wherein, a phase difference between two adjacent target clock signals in the group of target clock signals is a preset value;

wherein the data selection module is configured to:

receive the group of target clock signals through the signal transmission path, and perform sampling and selective outputting on a data signal by using the group of target clock signals, so as to output a target data signal.

11. The clock synchronization circuit of claim 10, wherein the preset value is 90 degrees;

the group of target clock signals comprises a first target clock signal, a second target clock signal, a third target clock signal and a fourth target clock signal;

clock cycles of the first target clock signal, the second target clock signal, the third target clock signal and the fourth target clock signal are all twice a clock cycle of the input clock signal; and the phase of the first target clock signal is the same as the phase of the synchronous clock signal.

12. The clock synchronization circuit of claim 11, wherein the sampling clock signal comprises a first sampling clock signal and a second sampling clock signal, and the phase of the first sampling clock signal is reverse to the phase of the second sampling clock signal;

a clock cycle of the first sampling clock signal is the same as the clock cycle of the input clock signal; a part of a rising edge of the first sampling clock signal aligns with a rising edge of the synchronous clock signal; and the other part of the rising edge of the first sampling clock signal aligns with a falling edge of the synchronous clock signal.

13. The clock synchronization circuit of claim 12, wherein the delay module comprises an adjustable delay link and a phase inverter;

the adjustable delay link is configured to receive the input clock signal and an adjustment signal, perform delay transmission on the input clock signal on the basis of the adjustment signal, and output the first sampling clock signal;

the phase inverter is configured to receive the first sampling clock signal, and output the second sampling clock signal.

14. The clock synchronization circuit of claim 12, wherein the latching module is specifically configured to:

latch the synchronous clock signal by using the first sampling clock signal, and output a clock signal to be processed;

latch, by using the second sampling clock signal, the clock signal to be processed, and output the second target clock signal;

latch the second target clock signal by using the first sampling clock signal, and output the third target clock signal;

latch the third target clock signal by using the second sampling clock signal, and output the fourth target clock signal; and latch the fourth target clock signal by using the first sampling clock signal, and output the first target clock signal.

15. The clock synchronization circuit of claim 10, wherein the delay-locked loop further comprises a receiving module, wherein the receiving module is configured to externally receive an initial clock signal, and output the input clock signal on the basis of the initial clock signal, wherein a clock cycle of the initial clock signal is the same as the clock cycle of the input clock signal.

16. The clock synchronization circuit of claim 10, wherein the delay-locked loop is specifically configured to output a first target clock signal, a second target clock signal, a third target clock signal and a fourth target clock signal on the basis of the input clock signal, wherein phases among the first target clock signal, the second target clock signal, the third target clock signal and the fourth target clock signal differ by 90 degrees in turn; and the data selection module is specifically configured to perform sampling and selective outputting on the data signal by using the first target clock signal, the second target clock signal, the third target clock signal and the fourth target clock signal, so as to obtain the target data signal.

17. A memory, comprising the clock synchronization circuit of claim 16.

18. The memory of claim 17, complying with DDR5 specification.

* * * * *